United States Patent [19]

Huttenlocher et al.

[11] Patent Number: 5,655,381
[45] Date of Patent: Aug. 12, 1997

[54] COOLING DEVICE FOR COOLING COMPONENTS AND BATTERIES IN A SWITCH CABINET

[75] Inventors: Werner Huttenlocher, Calw-Stammheim; Harald Knoblauch, Hamburg, both of Germany

[73] Assignee: Otto Pfannenberg Elektro-Spezialgerätebau GmbH, Hamburg, Germany

[21] Appl. No.: 402,191

[22] Filed: Mar. 10, 1995

[30] Foreign Application Priority Data

Jan. 23, 1995 [DE] Germany ............ 295 00 901.2

[51] Int. Cl.$^6$ ........................................... F25D 23/12
[52] U.S. Cl. ................. 62/259.2; 67/524; 361/696
[58] Field of Search ................. 62/259.2, 199, 62/524; 361/688, 690, 694, 695, 696

[56] References Cited

U.S. PATENT DOCUMENTS 4,123,919  11/1978  Fehlhaber .

5,465,591  11/1995  Cur et al. .................. 62/199

FOREIGN PATENT DOCUMENTS 1336076  11/1973  United Kingdom .
1364816  8/1974  United Kingdom .

Primary Examiner—John Sollecito
Attorney, Agent, or Firm—Friedrich Kueffner

[57] ABSTRACT

The cooling device serves for the cooling of electric and electronic components and of batteries in a switch cabinet, in which case in a housing (101) of the cooling device (100), a first heat exchanger (20) for the formation of a first cooling system (K1) for the chamber accommodating the electric and electronic compoents and a second heat exchanger (26) for the formation of a second cooling system (K2) that is independent of the first cooling system (K1) for the chamber accommodating the batteries are disposed, wherein both heat exchangers (20,26) are supplied from a common compressor (15) (FIG. 9).

18 Claims, 8 Drawing Sheets

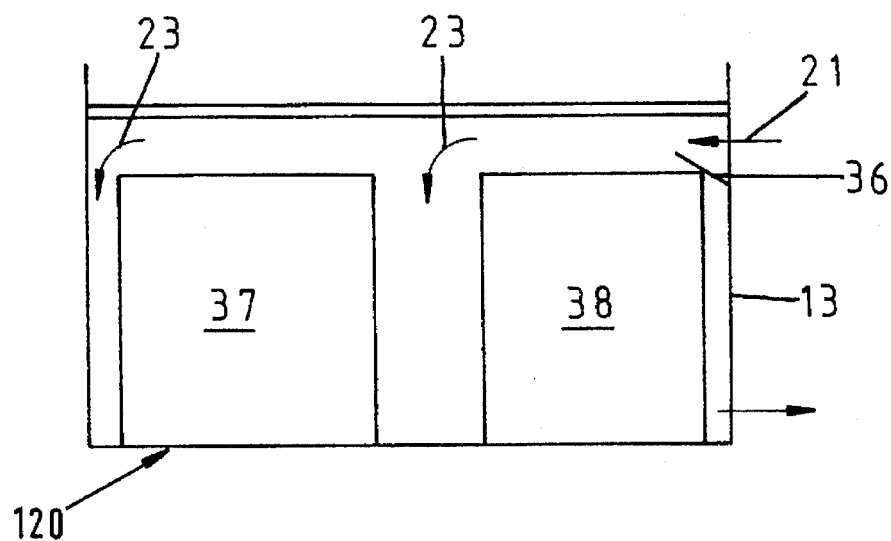
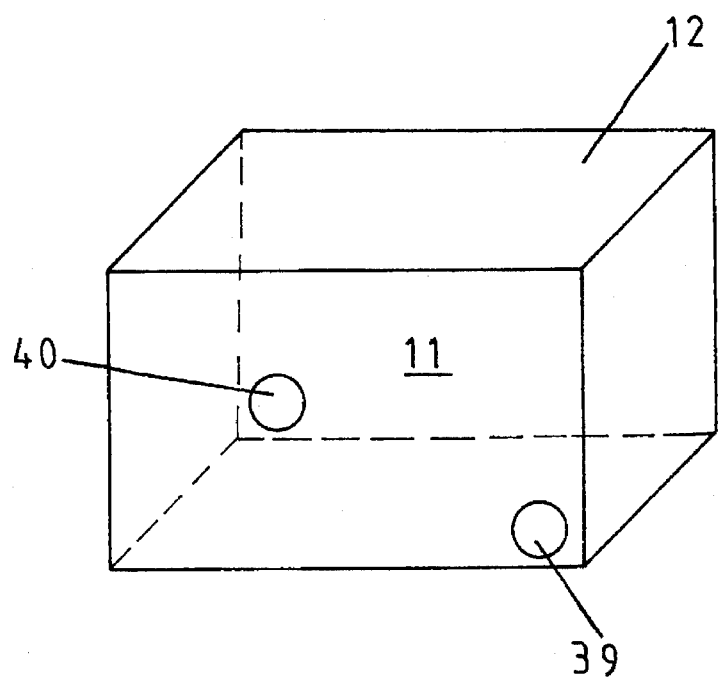

COOLING DEVICE FOR COOLING COMPONENTS AND BATTERIES IN A SWITCH CABINET

BACKGROUND OF THE INVENTION

1. Field of the Invention

The present invention relates to a cooling device for the cooling of electric and electronic components and batteries in a switch cabinet, more particularly for telecommunication facilities.

2. Description of the Prior Art

Cooling devices of the type stated serve for the preservation of electric and electronic components which have to be protected in relation to the external environment from contamination, against a possibly unauthorized access as well as from other forms of damage. In order to counteract the heat development in the switch cabinet interior during operation, according to the state of the art, ventilators are employed whose delivery volume has to be of an adequate magnitude for being able to ensure the desired temperature constancy within the interior of the housing. If the ventilators by themselves do not suffice, it will have to be additionally be arranged for further cooling means to be employed which take care of the requisite heat dissipation. For this, heat exchangers or cooling devices are available which are operated with the aid of a compressor. The limiting temperature within which the temperature in the housing interior has to be maintained at all times is guided by the most temperature-sensitive component, whereby it frequently becomes necessary to provide a stronger cooling than is necessary with regard to other components. The energy consumption to be made available is correspondingly greater. Thus, by way of example, rechargeable accumulators (storage batteries) require a lower cooling capacity than sensitive electronic components.

It is the technical problem of the present invention to develop a cooling device which possesses as simple as possible a construction and to ensure a heat dissipation harmonized with respect to the electric and electronic components or, when falling below a defined and predetermined temperature, heats the interior of the switch cabinet in interaction with the cooling device.

SUMMARY OF THE INVENTION

According to the invention, two independently acting and generated cooling systems are provided, whose flows of cold air are supplied parallel to each other to two spaces or chambers of a switch cabinet that are separated from each other, in which case the cooling capacity may be identical or differ, but will at all times be adapted to the necessary cooling requirement. While one of the two cooling systems is provided for the space or chamber in the switch cabinet wherein the electric and electronic components are accommodated, the second cooling system serves for the maintenance of a predetermined and necessary temperature in the other space or chamber of the switch cabinet, in which the batteries are accommodated. In addition, by means of an air flow system, the degassing of the battery chambers is assisted.

Accordingly, the invention provides a cooling system for dissipating the heat from electric and electronic components and, so far as batteries exist, also from these, in which case these components and batteries are accommodated in different spaces or chambers of a switch cabinet, and this while taking two temperature zones into consideration. With the aid of the cooling device, electric and electronic components in switch cabinets are protected from excessively elevated temperatures and from contaminations as well as from acquiring moisture from the external environment. Provision has to be made in this connection for the two spaces or chambers of the switch cabinet to be heated when the temperature falls below the desired temperature. In the event of the temperature falling below $-30°$ C. and of a simultaneous failure of the potential supply, when the potential is supplied once more, first of all the heating means which is installed underneath the respective condenser ventilators, is switched on so as to heat the ventilator motors. Only once the limiting temperature of $-30°$ C. is reached, are the ventilators switched on once again.

In this case the cooling device is constructed in such a way that the housing of the cooling device possesses an upper space or chamber having an upper intake for warm air drawn in by suction from a first space, a heat exchanger through which the warm air passes, an outlet for a flow of cold air coming from the first heat exchanger and a lower space separated from the upper space having a lower outlet for warm air drawn in by suction from a second space, a second heat exchanger passed through by the warm air, an outlet disposed adjacently to the outlet for the flow of cold air coming from the first heat exchanger for the flow of cold air coming from the second heat exchanger and a condenser and a ventilator disposed in a space or chamber separated from the two heat exchangers in the interior of the device housing, a lower intake for condenser supply air, in which both heat exchangers are supplied by a common compressor.

This cooling device can be employed on its own wherever two independent spaces or chambers have to be cooled. A special advantage results when the cooling device is employed in connection with a switch cabinet, whose interior is subdivided into two, advantageously superjacent, spaces or chambers, of which the one chamber accommodates the electric and electronic compoents and the other one accommodates batteries. However, the possibility also exists of disposing only electric and electronic components in both chambers, which is always of advantage when the components have to be exposed to two different cooling temperatures.

The cooling device and the switch cabinet may be rigidly or detachably interconnected. The contiguously located walls of the housing of the cooling device and of the switch cabinet do in this case possess intake orifices for the warm air and outlet orifices for the cold air. In addition, according to a further embodiment, the cooling device may be integrated into the switch cabinet, in which case the interior of the cooling device is then separated from the interior of the switch cabinet by a partition in which the warm air intakes and cold air outlets are constructed and in which case the partition separating the first space of the switch cabinet from the second space is expediently located in the same place in which the partition separating the upper space from the lower space is disposed.

The cooling device possesses a space accommodating the batteries (battery chamber) of a second space enclosing the remaining components, in which case one heat exchanger is allocated to each space or chamber. Both heat exchangers are supplied from a common compressor, it being necessary in this case to harmonize each heat exchanger with respect to the heat dissipation capacity with the relevant spaces or chambers to be cooled or the components located in them. The common compressor makes a second compression unit unnecessary. The separation of the battery space from the first space accommodating the components makes the adjustment of different temperatures possible in the spaces in question. Also with regard to the ventilation and venting, the separate chambers can be adapted to the respective requirements, in which case in particular the gases being generated when a battery is charged are from the outset not delivered along into the flow of recirculated air which is conducted into the first space housing the electric and electronic components.

The first and the second chamber are preferably conconstructed so as to be adjacent to each other and separated by a common partition which, according to a further construction of the invention, is of single-layer design.

According to a further construction of the invention, the first and the second chamber are disposed so as to be located on top of each other, in which case the spaces accommodating or containing the heat exchangers follow at the rear likewise superjacently arranged. Expressed in a different way, the cooling aggregate part of the cooling device is located within the rearward region where it extends over the entire overall height of the device housing. The cooling device is advantageously disposed behind the switch cabinet, which disposition has the advantage of all electric and electronic components as well as the batteries being accessible from the front, while the cooling units are accessible from the rear so that, in the event of a possible breakdown, in the front portion the heat exchangers and the compressor are just as little in the way of a repair as the other way around. By preference, one ventilator each is in each case embedded in the partition between the first space and the allotted heat exchanger space and the Second space and the heat exchanger space allocated to the latter. The ventilators are preferably disposed so as to be spaced apart as far as possible so that the cooling air leaving the heat exchangers is in each case blown in or conducted along there close to the common partition in the first and second chamber of the switch cabinet. Especially when the cooling air is conducted along the partition between the battery chamber, i.e. the second lower chamber and the first upper chamber, it is possible to keep the temperature gradient as small as possible. A passage of heat from the warmer chamber into the colder chamber is thus very largely minimized.

An optimal circulation of circulating air in the first chamber containing the electric or electronic components of the switch cabinet can be ensured when the first chamber possesses, on its rear, a cold air entry slot extending substantially across the entire width of the space in the vicinity of the partition. In this case, the ventilator embedded in the chamber rear wall within the upper region delivers warm air from the second chamber, which is conducted past a heat exchanger and cooled, whereupon it is insufflated again in the form of cold air via the cold air slot above the bottom formed by the partition.

Moreover and preferably the second chamber, the battery chamber of the switch cabinet, is provided on its front end with an adjustable aperture which is employed for eliminating the gases developing when batteries are charged together with the warm recirculated air. In this case, by way of example, warm air from the battery chamber is drawn in by suction on the rear wall in the proximity of the bottom, mixed with fresh air which is cooled while flowing past a heat exchanger and which is, in the form of cold air, once again supplied to the battery chamber below the intermediate plate. For the maintenance of an air circulation in the battery chamber serves, in a supporting capacity, a deflector plate provided according to a further construction, projecting from the partition to the more closely disposed battery or series of batteries, which prevents air from being drawn in direct by suction over a short distance. This deflector plate guides the cold air streaming into the battery space in such a way that a circulation around the batteries arranged in the battery chamber is ensured so that no local overheating can take place. Alternatively to the adjustable aperture provided on the front end of the battery chamber, it is also possible for diametrically opposed apertures to be provided within the lower region of the battery space which are preferably disposed in the front wall and in the rear wall and via which the gases forming when the battery or batteries are charged, are exhausted while being mixed with fresh air.

The common compressor is preferably disposed in a space or chamber separated from the heat exchangers that is pressure-ventilated and pressure-vented and provided with an intake orifice and an outlet orifice. A ventilator is provided preferably in the intake orifice for assisting in the circulation of air in this chamber.

According to a further construction of the invention, for the regulation of the delivered air volumes and the ventilator operating speed, a common control unit connected to a temperature and pressure regulation means, which makes a selective temperature adjustment in each of the switch cabinet chambers possible.

By preference, stainless steel is used as corrosion-resistant material for all metallic components and especially for the housing, plastic materials may also be employed here to the extent in which this is possible.

BRIEF DESCRIPTION OF THE DRAWINGS

In the drawings:

FIG. 6 shows a partial view of the battery chamber of the switch cabinet;

FIG. 7 shows a perspective partial view of the battery chamber of the switch cabinet with alternative air intake and air outlet orifices;

DETAILED DESCRIPTION OF THE PREFERRED EMBODIMENT

Figure 1:
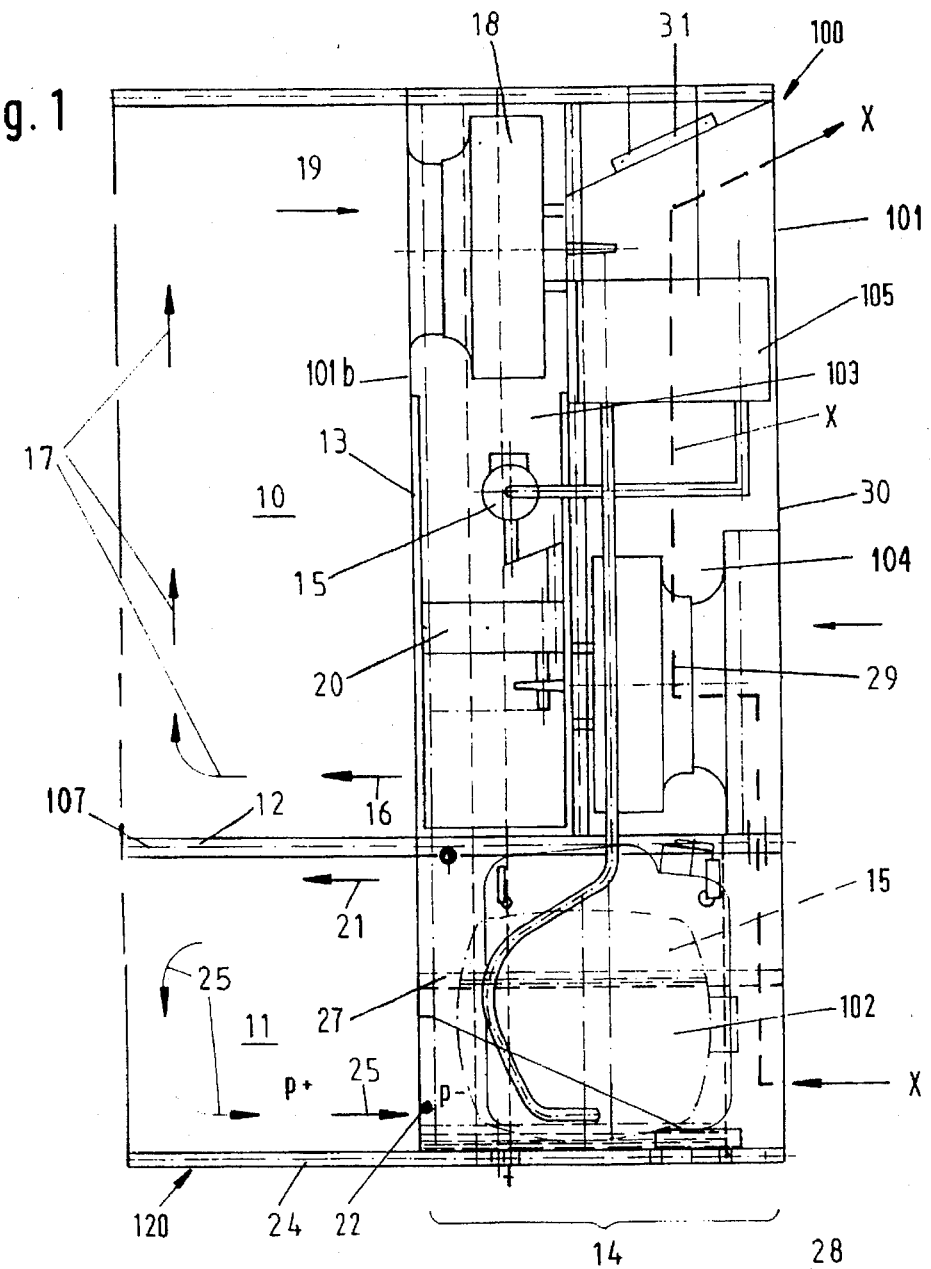
FIG. 1 shows a cross-sectional basic diagram of the cooling device with the switch cabinet.
Figure 9:
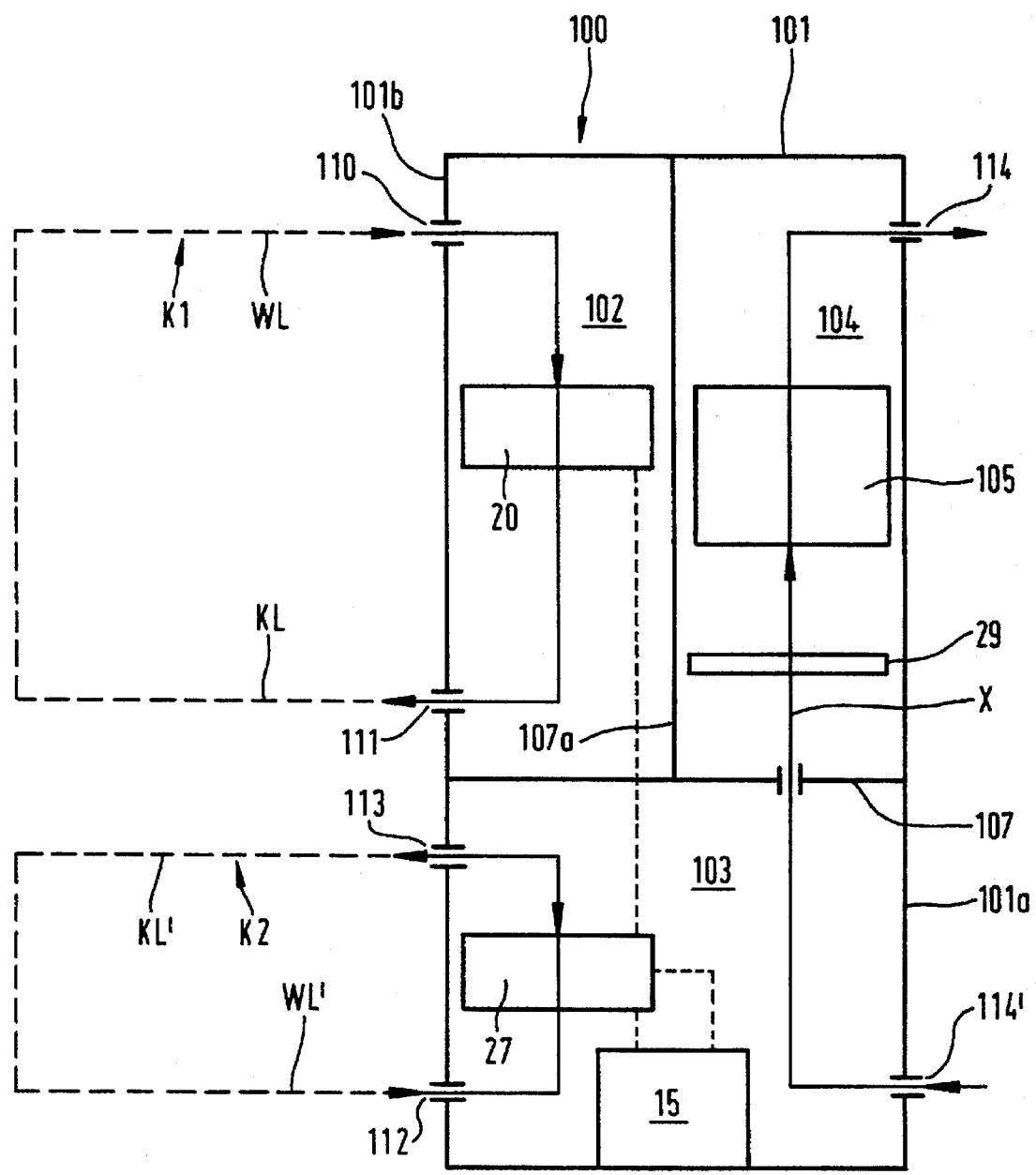
FIG. 9 shows the cooling device in a schematic view.
Figure 10:
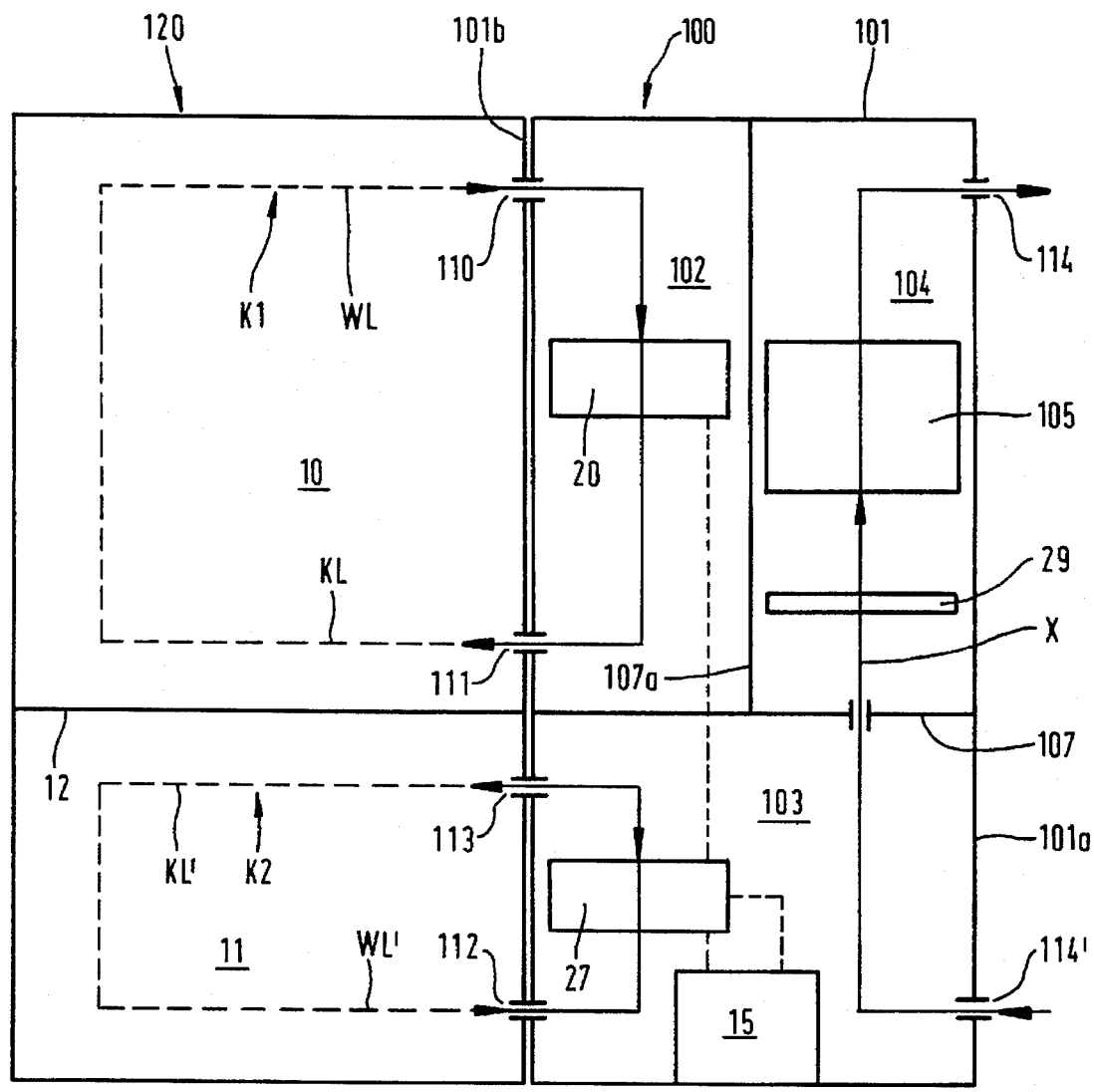
FIG. 10 shows the cooling device with attached switch cabinet in a schematic view.

In the FIGS. 1, 9 and 10, a cooling device is identified with 100 with its housing 101 and a switch cabinet with 120, whose interior is subdivided into an upper, first chamber 10 for accommodation of electric and electronic components and into a lower, second chamber 11 for the accommodation of batteries 37,38. Both chambers 10, 11 are separated from each other by means of a partition 12.

The interior of the cooling device 100 is expediently subdivided into three spaces or chambers 102, 103, 104 with the aid of partitions 107, 107a (FIGS. 1 and 9). For the formation of a first cooling system K1, in the chamber 102, a first heat exchanger 20 and, in the chamber 103, a second heat exchanger 26 is disposed for the formation of a second cooling system K2. The flows of warm air are identified by WL, WL' and the flows of cold air with KL,KL'. Both heat exchangers 20,26 are supplied from a common compressor 15 mounted in the chamber 103. In the chamber 104, a condenser (heat exchanger) 105 is mounted. The conduction of the air in this case is effected in the direction of arrow X (FIG. 1). In the wall 101a of the housing of the cooling device, an intake aperture 114' is provided in the bottom for the condenser air supply which, via an air duct not depicted in the drawing, is supplied to a ventilator 29 mounted in the chamber 104 and, from the same, is supplied to the condenser 105.

The removal of the air coming from the condenser 105 is effected via an upper outlet aperture 114 in the device housing wall 101a, within whose area a deflector plate 31 is disposed (FIGS. 1 and 9).

In the other wall 101b of the housing 101 of the cooling device 100, the intakes and outlets for the flows of warm air and cold air are provided. For the supply of warm air from the first chamber 10 of the switch cabinet 120, an intake aperture 110 is provided to which a ventilator is allocated; this will be discussed in greater detail hereinafter. The outlet aperture 111 for the flow of cold air coming from the first heat exchanger 20 is disposed above the partition 12. The intake aperture 112 for the flow of warm air from the lower chamber 11 of the switch cabinet 120 is provided at the bottom in the wall 101b of the housing 101 of the cooling device 100 and the outlet aperture 113 for the flow of cold air coming from the second heat exchanger is provided below the partition 12 so that both cold air flows of the two cooling systems K1, K2 pass above and below the partition 12.

Figure 2:
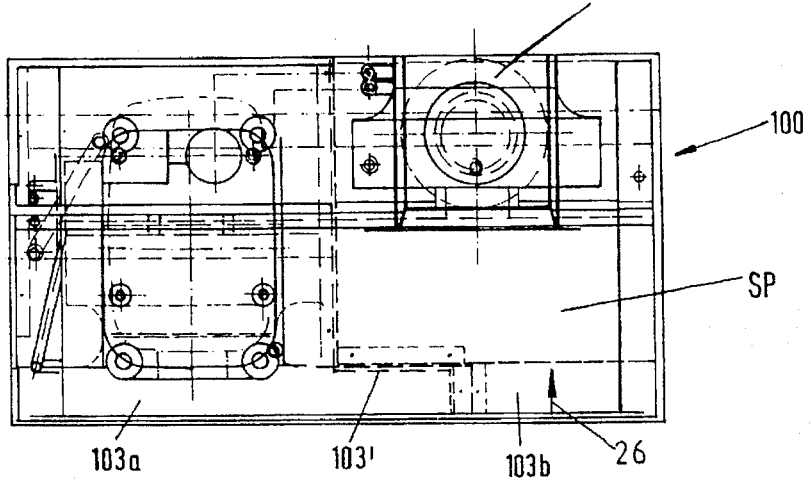
FIG. 2 shows a basic sectional view of the cooling device viewed from the top.
Figure 3:
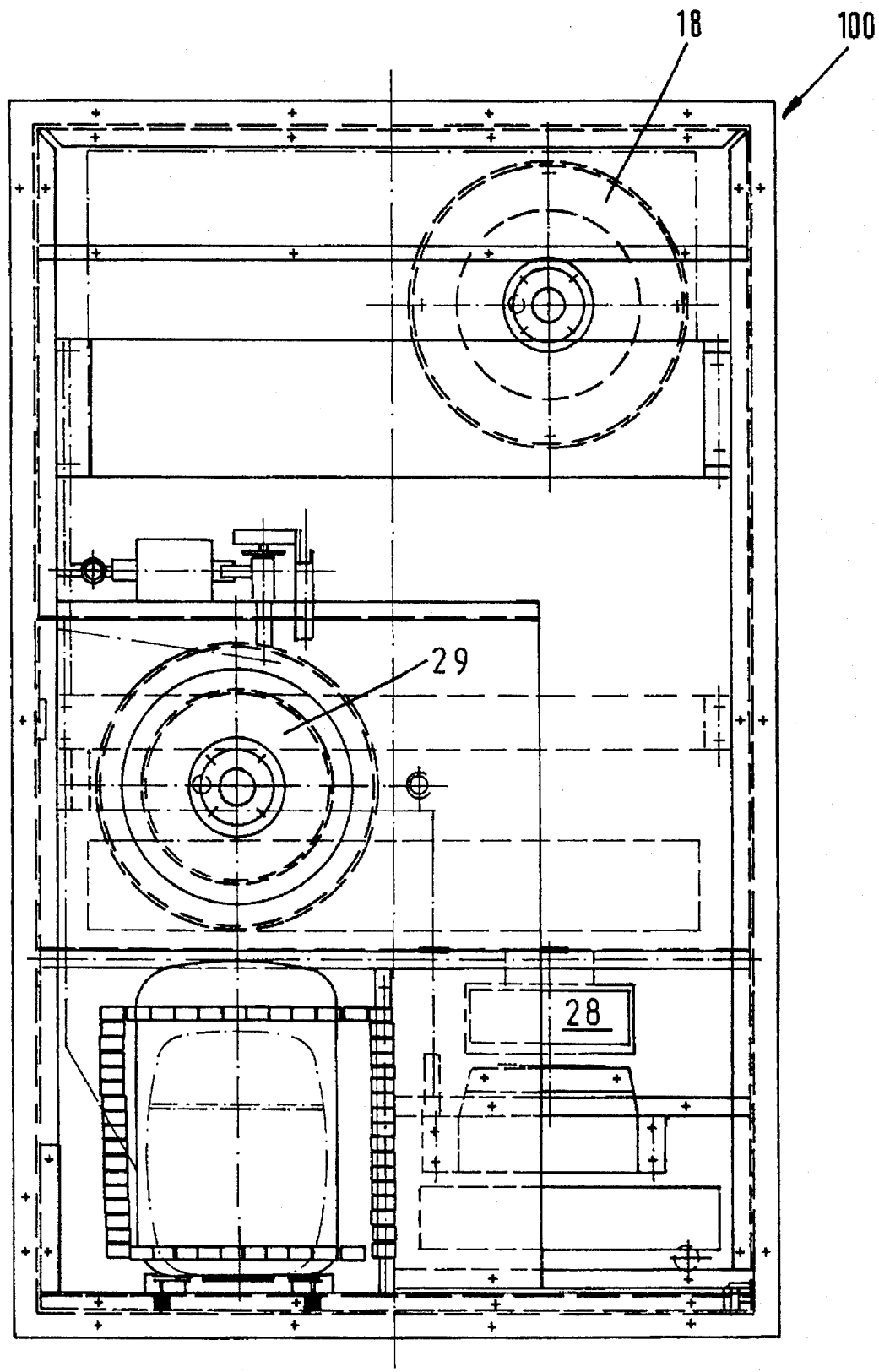
FIG. 3 shows a view of the cooling device in a sectional view from the front.

Via the intake aperture 114' for the condenser supply air, fresh air is delivered at the same time into the chamber 103 of the cooling device in order to form a self-adjusting air system in the two chambers 103, 11 of the cooling device and the switch cabinet. By means of the suctionally drawn-in condenser air, a partial vacuum is produced in the space 103 so that the air from the battery chamber 11 is able to escape via an adjustable outlet in order to vent the battery chamber and to remove gases from the same. The lower chamber 103 of the cooling device 100 is preferably subdivided into a space 103a accommodating the compressor 15 and a space 103b accommodating the heat exchanger 26, in which case the two spaces 103a, 103b are separated from each other with the aid of a partition 103'. So far as intakes and outlets are necessary for the air flows of the cooling system K2, provision has been made for the same (FIG. 2).

Figure 11:
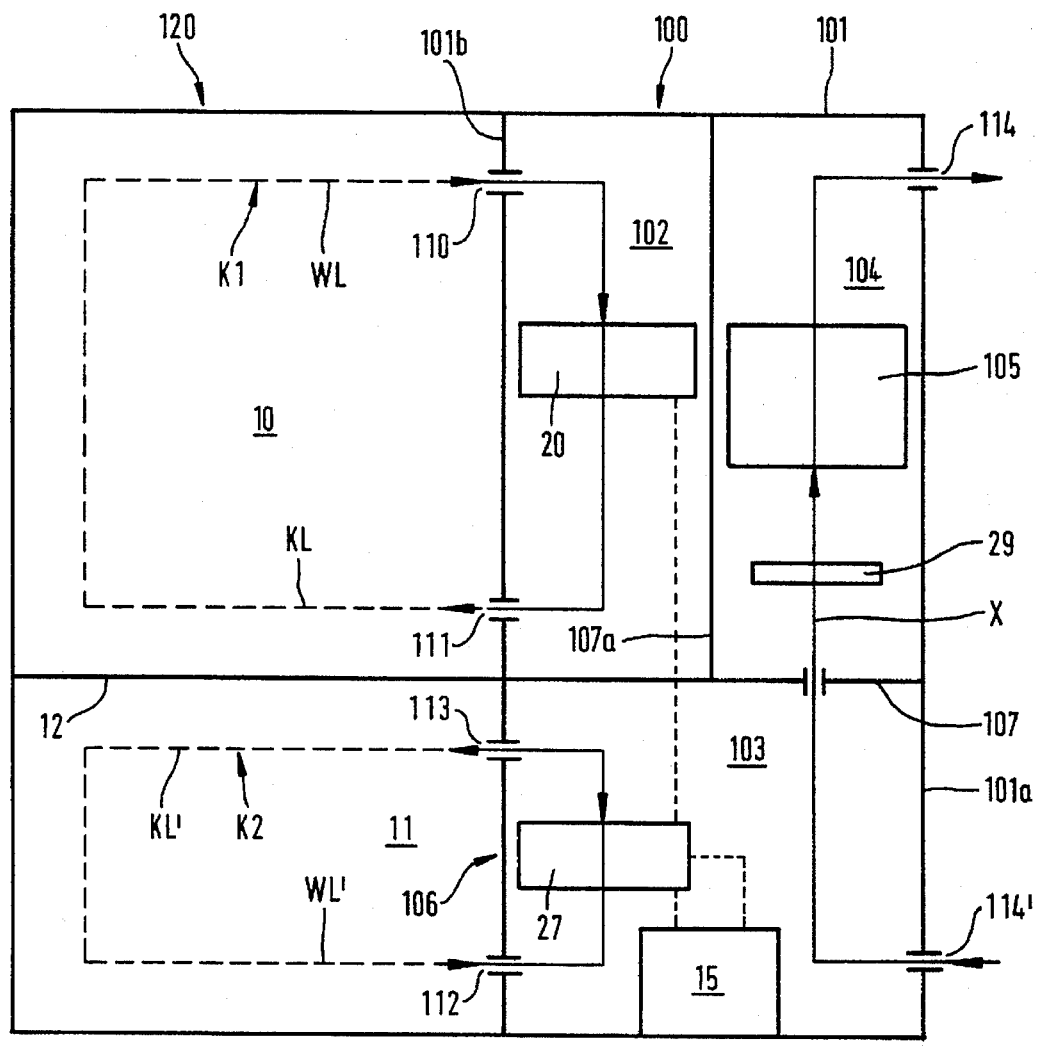
FIG. 11 shows the cooling device integrated into the switch cabinet.

In the embodiment in which the cooling device is incorporated into the interior of the switch cabinet as per FIG. 11, a sole partition 101b separating the cooling device and the switch cabinet is provided, in which the intake apertures 110, 112 and the outlet apertures 111,113 are disposed. The partition 107 separating the two superjacent chambers 102, 103 of the cooling device 100 is located in the plane of the partition 12 of the switch cabinet 120, in which case it is also possible to provide a sole continuous partition which separates the chambers 10, 11 of the switch cabinet 120 and the chambers 102, 103 of the cooling device 100 (FIGS. 1 and 11).

The switch cabinet 120 which interacts with the cooling device 100 possesses separate chambers 10 for the accommodation of the electric and electronic components and 11 for accommodating the batteries 37, 38 which are disposed on top of each other and separated from each other by means of a common partition 12 in the form of a sheet metal plate. The common rear wall of the chambers 10,11 borders on to the cooling device portion 14 which constitutes the cooling device 100 and in which one heat exchanger each for the chamber 10 and the chamber 11 besides a common compressor 15 are located. The cold air flows in the direction of the arrow 16 above the partition plate 12 and, in the recirculation operation, according to the arrows 17, is conducted past the electronic components not shown in the drawing, where it is warmed up and drawn in by suction via the ventilator 18 in the direction of the arrow 19. From there it enters into the rearward space where it is colled off by the heat exchanger 20 in order to be then once more introduced in the form of cooling air in the direction of the arrow 16. The air conducted into the battery chamber 11 in the direction of the arrow 21 does issue in part in the direction of the straight arrow 25 from an opening provided there; the remaining part is passed on in the direction of the curved arrows 25 in the recirculation operation where, in the lower region close to the bottom 24 at the rear it is drawn in by suction in the direction of the arrow 25' and conducted via a heat exchanger 27 and cooled. The present construction thus ensures that the respective cold air—arrow 16 and arrow 21—is passed at approximately identical temperatures past the partition plate 12. The flow of cold air according to the arrows 16 and 21 may be of a different magnitude, by way of example 21° C. in the battery chamber and 24° C. in the chamber 10 located thereabove. The battery chamber 11, as indicated by arrow 26, is ventilated with ambient air which replaces the air escaping from the opening 22 which contains the gases formed during the charging of the batteries, with fresh air components. As can be gathered from the FIG. 2, the air is drawn in by suction into a space SP in which a partial vacuum prevails since air is conducted away by means of the ventilator 28. The rear wall 30 of the switch cabinet comprises, before the compressors, a further condenser ventilator 29 which serves to supply air to the rear (heat exchanger) space, which is able to flow away towards the rear guided past the deflector plate 31.

Figure 4:
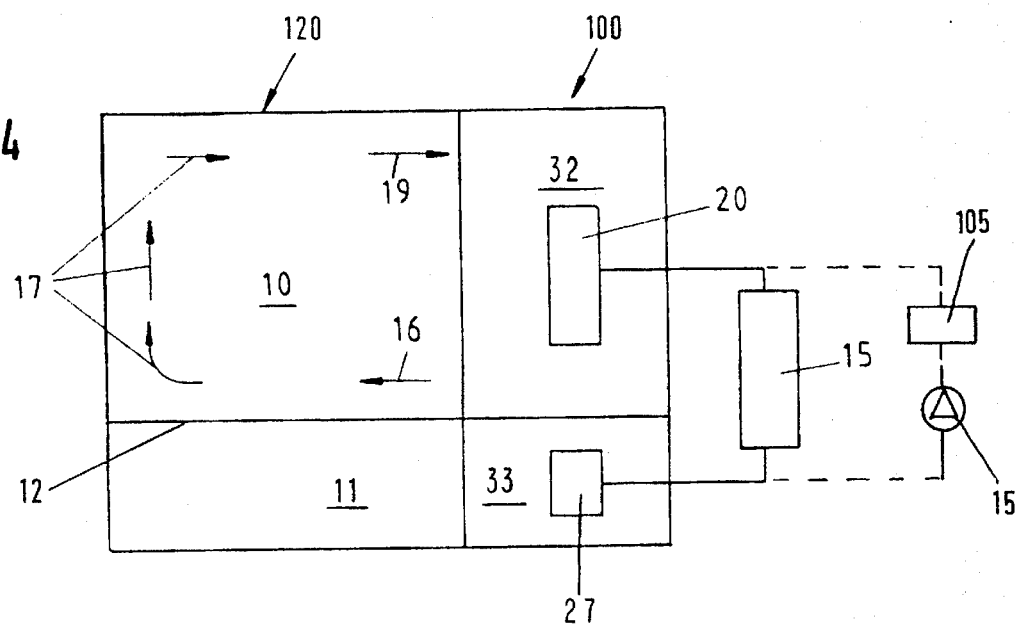
FIG. 4 shows a basic side view of the cooling device with the switch cabinet for representing the air conduction.

The flow priciple of the delivered volumes of air becomes clear especially schematically with the aid of FIG. 4 in that the anterior chambers 10 and 11 are depicted just like the chambers 32 and 33 accommodating the heat exchanger 20 or the heat exchanger 27. The heat exchangers 20 and 27 communicate with a common compressor 15.

Figure 5:
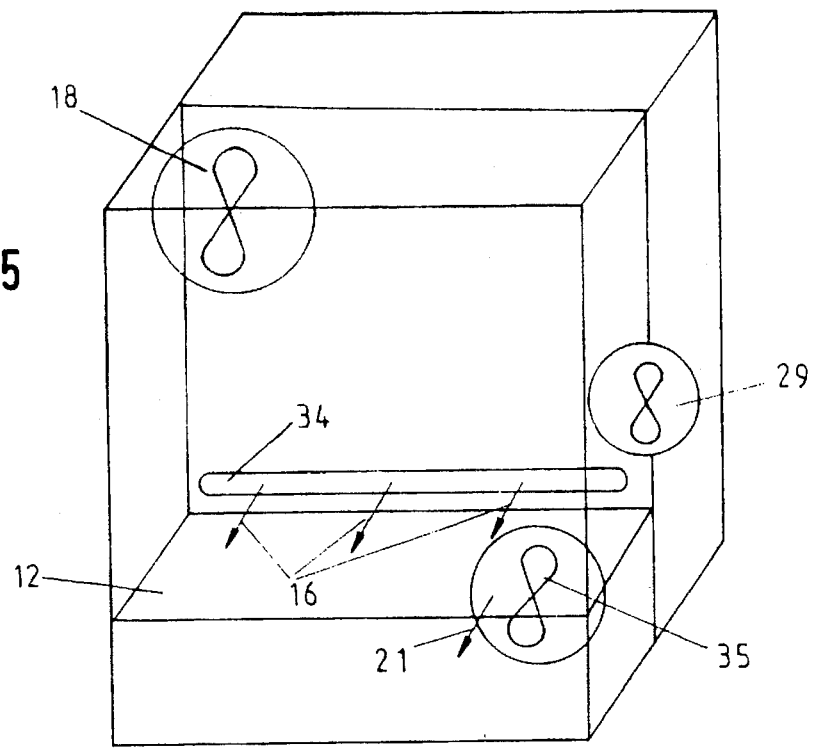
FIG. 5 shows a perspective view of the cooling device with the switch cabinet.

From FIG. 5 it bacomes apparent that the fresh air supply (arrows 16) is effected via an air outlet slot 34 which is located above the partition 12 and extends across the entire width of the rear wall of the chamber 10. The already described exhauster 18 serves for the removal of air from this chamber 10. Below the partition 12, a ventilator 35 is likewise provided which delivers the air according to arrow 21 into the battery chamber. The ventilator 29 serves for the ventilation of the heat exchanger and compressor chamber. In addition, it can be gathered from FIG. 6 in schematic illustration that a deflector plate 36 prevents that the air flowing in along the arrow 21 flows downwardly immediately on the battery chamber rear wall 13 and issues again from this chamber. Rather, the cold air (arrow 21) is guided in such a way that it flows uniformly around the batteries 37, 38 in the form of partial air flows (arrow 23). An alternative supply and removal of fresh air can be gathered from FIG. 7, which represents the battery chamber 11 schematically. Pertinent fresh air intake apertures 39 and outlet apertures 40 see to it that fresh air is drawn in from the outside with the support of the ventilators and the gases which develop when the batteries are charged are removed via the aperture 40.

The upper roof wall 12 is also in this case constituted by the partition plate between the battery chamber 11 and the electronic subchamber 10.

Figure 8:
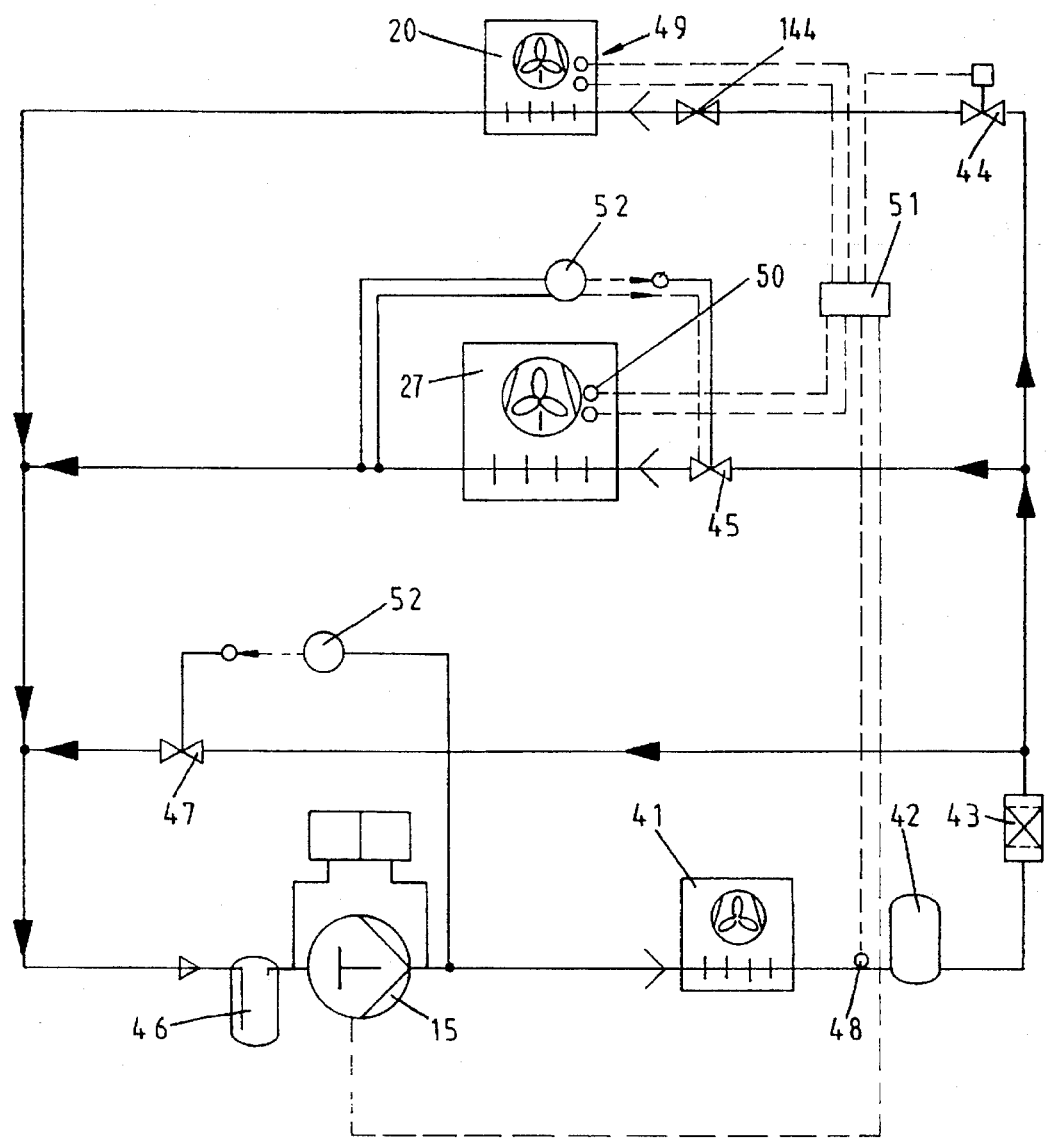
FIG. 8 shows a basic sketch of the coolant flow inside the cooling device.

FIG. 8 shows the cooling circuit of the switch cabinet according to the invention with a compressor 15, from which the compressed medium is given off to a condenser 41, from where the liquid medium reaches a collector 42. By the interposition of a filter 43, the liquid is supplied in a dosed manner to the heat exchangers 20 and 26 with the aid of a magnetic valve 44, a capillary tube 144 as pressure regulation area and a cutoff valve with expansion 45. After having been warmed in the heat exchanger, the liquid reaches, in the form of cooling medium, a liquid trap 46, from where it is drawn by means of suction into the compressor 15. By means of the valve 47 the possibility exists of regulating the pressure tube temperature of the compressor at low load with the aid of subsequent injection. Various sensors 48, 49 and 50, which are connected to a central control unit 51, serve as adjusting signal transmitters for valves and ventilation. The control should be effected in such a way that a temperature range defined by minimal and maximal values in the chambers 10 and 11 is kept within or is exceeded. The ventilator capacity has to be harmonized depending upon the size of the chambers and temperature development of the individual units or the cooling capacity of the heat exchangers.

What is claimed is:

1. A cooling device for cooling electric and electronic components and batteries in a switch cabinet, the cooling device comprising a housing having a first chamber, a second chamber below the first chamber and a third chamber separate from the first and second chambers, a first heat exchanger mounted in the first chamber of the housing, the first chamber having a top intake for warm air drawn by suction from a first chamber of the switch cabinet and passed through the first heat exchanger, and an outlet for cold air conducted from the first heat exchanger, a second heat exchanger mounted in the second chamber of the housing, the second chamber having a bottom intake for warm air drawn by suction from a second chamber of the switch cabinet and passed through the second heat exchanger, and an outlet for cold air conducted from the second heat exchanger, the outlet for cold air conducted from the first heat exchanger being located adjacent the outlet for cold air conducted from the second heat exchanger, and a condenser and a ventilator mounted in the third chamber of the housing, the third chamber of the housing having a lower intake for supplying condensed air and an upper outlet for condenser exhaust air, further comprising a compressor for feeding both the first and the second heat exchangers, wherein the housing of the cooling device is rigidly connected to the switch cabinet, wherein the first chamber of the switch cabinet is arranged above the second chamber of the switch cabinet, such that the first chamber of the switch cabinet is in communication with the top intake and the outlet of the first chamber of the housing for forming a first cooling system including the first heat exchanger, and the second chamber of the switch cabinet is in communication with the bottom intake and the outlet of the second chamber of the housing for forming a second cooling system including the second heat exchanger, and wherein the electric and electronic components are arranged in the first chamber of the switch cabinet and the batteries are arranged in the second chamber of the switch cabinet.

2. A cooling device for cooling electric and electronic components and batteries in a switch cabinet, the cooling device comprising a housing having a first chamber, a second chamber below the first chamber and a third chamber separate from the first and second chambers, a first heat exchanger mounted in the first chamber of the housing, the first chamber having a top intake for warm air drawn by suction from a first chamber of the switch cabinet and passed through the first heat exchanger, and an outlet for cold air conducted from the first heat exchanger, a second heat exchanger mounted in the second chamber of the housing, the second chamber having a bottom intake for warm air drawn by suction from a second chamber of the switch cabinet and passed through the second heat exchanger, and an outlet for cold air conducted from the second heat exchanger, the outlet for cold air conducted from the first heat exchanger being located adjacent the outlet for cold air conducted from the second heat exchanger, and a condenser and a ventilator mounted in the third chamber of the housing, the third chamber of the housing having a lower intake for supplying condensed air and an upper outlet for condenser exhaust air, further comprising a compressor for feeding both the first and the second heat exchangers, wherein the housing of the cooling device is detachably connected to the switch cabinet, wherein the first chamber of the switch cabinet is arranged above the second chamber of the switch cabinet, such that the first chamber of the switch cabinet is in communication with the top intake and the outlet of the first chamber of the housing for forming a first cooling system including the first heat exchanger, and the second chamber of the switch cabinet is in communication with the bottom intake and the outlet of the second chamber of the housing for forming a second cooling system including the second heat exchanger, and wherein the electric and electronic components are arranged in the first chamber of the switch cabinet and the batteries are arranged in the second chamber of the switch cabinet.

3. The cooling device according to claim 1, wherein the housing of the cooling device is integrated with the switch cabinet, wherein the first chamber of the switch cabinet is arranged above the second chamber of the switch cabinet, such that the first chamber of the switch cabinet is in communication with the top intake and the outlet of the first chamber of the housing for forming a first cooling system including the first heat exchanger, and the second chamber of the switch cabinet is in communication with the bottom intake and the outlet of the second chamber of the housing for forming a second cooling system including the second heat exchanger, and wherein the electric and electronic components are arranged in the first chamber of the switch cabinet and the batteries are arranged in the second chamber of the switch cabinet, further comprising a partition between the housing of the cooling device and the switch cabinet, the partition containing the top and bottom intakes and the outlets of the first and second chambers of the housing, wherein a partition separating the first and second chambers of the switch cabinet extends in the same plane as a partition separating the first and second chambers of the housing.

4. The cooling device according to claim 1, wherein the compressor is arranged in the second chamber of the housing, wherein the second chamber is configured to produce a negative pressure such that a pressure difference between the second chamber of the housing and the second chamber of the switch cabinet causes venting of the second chamber of the switch cabinet.

5. The cooling device according to claim 1, wherein the first and second chambers of the switch cabinet are located adjacent to each other and are separated from each other by a common partition.

6. The cooling device according to claim 1, wherein the first chamber of the switch cabinet is located above the second chamber of the switch cabinet and the first and second chambers of the housing are located adjacent a rear wall of the switch cabinet.

7. The cooling device according to claim 1, comprising a first ventilator in a wall between the first chamber of the switch cabinet and the first chamber of the housing, and a second ventilator in a wall between the second chamber of the switch cabinet and the second chamber of the housing.

8. The cooling device according to claim 7, wherein the first and second ventilators are disposed so as to be spaced apart as far as possible, wherein the first and second chambers of the switch cabinet are configured such that cooling air leaving the heat exchangers is introduced into the first and second chambers of the switch cabinet close to a common partition between the first and second chambers of the switch cabinet.

9. The cooling device according to claim 1, wherein the first chamber of the switch cabinet contains the electric or electronic components and has in a rear wall a cold air entry slot extending substantially across a width of the first chamber of the switch cabinet adjacent a partition between the first and second chambers of the switch cabinet.

10. The cooling device according to claim 1, wherein the second chamber of the switch cabinet has an adjustable aperture on a front side thereof.

11. The cooling device according to claim 1, wherein the second chamber of the housing has a fresh air intake aperture.

12. The cooling device according to claim 7, comprising a deflector plate mounted below the second ventilator, the deflector plate projecting from the partition between the second chamber of the switch cabinet and the second chamber of the housing toward a battery in the second chamber of the switch cabinet located closest to the partition.

13. The cooling device according to claim 1, wherein the second chamber of the switch cabinet has a front wall and a rear wall, the front wall and the rear wall having diametrically oppositely located openings for conducting gases forming during charging of the batteries.

14. The cooling device according to claim 1, wherein the compressor is disposed in the third chamber of the housing, the third chamber of the housing having means for pressure-ventilating and pressure-venting the third chamber, the third chamber further having an intake aperture and an outlet aperture.

15. The cooling device according to claim 14, comprising a ventilator in the intake aperture.

16. The cooling device according to claim 1, further comprising a control unit connected to a temperature control for regulating air flow volumes and ventilator operating speeds.

17. The cooling device according to claim 1, wherein partitions between the chambers of the switch and of the housing are of stainless steel.

18. The cooling device according to claim 6, wherein each ventilator comprises a heating unit for heating ventilator motors for controlling start-up of the ventilators.

* * * * *